United States Patent
Curlee et al.

(10) Patent No.: US 11,582,874 B2
(45) Date of Patent: Feb. 14, 2023

(54) INTERLOCKING TRANSPORTATION TOTES

(71) Applicant: Dell Products L.P., Round Rock, TX (US)

(72) Inventors: James Don Curlee, Round Rock, TX (US); Steven Embleton, Austin, TX (US); Joshua Scott Keup, Austin, TX (US); Ben John Sy, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 295 days.

(21) Appl. No.: 16/743,198

(22) Filed: Jan. 15, 2020

(65) Prior Publication Data

US 2021/0219443 A1    Jul. 15, 2021

(51) Int. Cl.
*H05K 5/02* (2006.01)
*H05K 7/18* (2006.01)
*H05K 5/00* (2006.01)

(52) U.S. Cl.
CPC ......... *H05K 5/0208* (2013.01); *H05K 5/0013* (2013.01); *H05K 5/0221* (2013.01); *H05K 5/0234* (2013.01); *H05K 7/18* (2013.01)

(58) Field of Classification Search
CPC .. H05K 5/0013; H05K 5/0208; H05K 5/0221; H05K 5/0234; H05K 7/18
See application file for complete search history.

(56) References Cited

U.S. PATENT DOCUMENTS

| | | |
|---|---|---|
| 4,728,160 A | 3/1988 | Mondor et al. |
| 5,278,742 A | 1/1994 | Garrett |
| 5,282,114 A | 1/1994 | Stone |
| 5,298,681 A | 3/1994 | Swift et al. |
| 5,432,691 A | 7/1995 | Garrett et al. |
| 5,499,790 A | 3/1996 | Hey |
| 5,897,180 A | 4/1999 | Singer |

(Continued)

FOREIGN PATENT DOCUMENTS

| | | | |
|---|---|---|---|
| JP | 2007-209544 A | * | 8/2007 |
| JP | 4501017 B | * | 7/2010 |
| WO | 2017/087948 A1 | * | 5/2017 |

OTHER PUBLICATIONS

Affordable Display Products, Wood Chart File Wall Rack with 4 Pockets, https://www.affordabledisplayproducts.com/Display-Products/Medical-Chart-File-Flolders-Hanging-File-Folder-Racks-Medical-Chart-Holders/CH14-2-Chart-File-Wall-Rack-Wood.

(Continued)

*Primary Examiner* — Carl J Arbes
(74) *Attorney, Agent, or Firm* — Jackson Walker L.L.P.

(57) ABSTRACT

A system may include first and second apparatuses. The first and second apparatuses may each include: an enclosure portion including a plurality of mounting features that are configured to receive information handling systems, wherein dimensions of the enclosure portion define a footprint; a base portion disposed below the enclosure portion and coupled to the enclosure portion; a plurality of casters coupled to the base portion and mounted in respective positions that are laterally displaced from the base portion such that the positions are outside the footprint of the enclosure portion; and a locking mechanism. The first and second apparatuses may be operable to be coupled together via their respective locking mechanisms for transport.

18 Claims, 8 Drawing Sheets

(56) References Cited

U.S. PATENT DOCUMENTS

| | | | |
|---|---|---|---|
| 6,112,672 A | 9/2000 | Heil | |
| 6,357,077 B1 | 3/2002 | Jones et al. | |
| 6,406,011 B1 | 6/2002 | Kosar et al. | |
| 6,439,528 B1 | 8/2002 | Goto et al. | |
| 6,530,563 B1 | 3/2003 | Miller et al. | |
| 7,108,111 B2 | 9/2006 | Spyche, Jr. et al. | |
| 7,304,855 B1 | 12/2007 | Milligan et al. | |
| 7,551,971 B2 | 6/2009 | Hillis | |
| 7,556,271 B2 | 7/2009 | Robbins et al. | |
| 7,581,738 B1 | 9/2009 | Hartzell et al. | |
| 7,854,652 B2 | 12/2010 | Yates et al. | |
| 8,490,413 B2 | 7/2013 | Blackway et al. | |
| 8,638,553 B1 | 1/2014 | Czamara et al. | |
| 9,423,001 B2 | 8/2016 | Green et al. | |
| 9,526,193 B2 | 12/2016 | Demange et al. | |
| 9,701,330 B2 | 7/2017 | Mkandawire et al. | |
| 9,732,979 B2 | 8/2017 | Fadell et al. | |
| 9,992,913 B1 | 6/2018 | Czamara et al. | |
| 10,093,450 B2 | 10/2018 | Embleton et al. | |
| 10,334,749 B2 | 6/2019 | Eckberg et al. | |
| 10,724,599 B2 | 7/2020 | Embleton et al. | |
| 10,780,907 B1 | 9/2020 | Camarco et al. | |
| 10,850,757 B1 | 12/2020 | Curlee et al. | |
| 2003/0041409 A1 | 3/2003 | Caporale | |
| 2005/0116431 A1 | 6/2005 | Holtan et al. | |
| 2006/0201759 A1 | 9/2006 | Spyche et al. | |
| 2006/0243690 A1 | 11/2006 | Mollard | |
| 2006/0288659 A1 | 12/2006 | Scheid et al. | |
| 2010/0243586 A1 | 9/2010 | Henderson et al. | |
| 2011/0068548 A1 | 3/2011 | Houggard et al. | |
| 2011/0085152 A1 | 4/2011 | Nishino et al. | |
| 2011/0149508 A1 | 6/2011 | Malekmadani | |
| 2011/0279973 A1 | 11/2011 | Terwilliger et al. | |
| 2012/0062084 A1 | 3/2012 | Lewis, II et al. | |
| 2012/0104917 A1 | 5/2012 | Fan | |
| 2012/0273438 A1 | 11/2012 | Nordin et al. | |
| 2013/0032310 A1 | 2/2013 | Jaena et al. | |
| 2013/0328253 A1 | 12/2013 | Kraner et al. | |
| 2015/0146354 A1 | 5/2015 | Franz | |
| 2015/0173253 A1 | 6/2015 | Lewis, II et al. | |
| 2015/0181748 A1 | 6/2015 | Bailey et al. | |
| 2015/0186840 A1 | 7/2015 | Torres et al. | |
| 2015/0334866 A1 | 11/2015 | Bailey et al. | |
| 2016/0073547 A1 | 3/2016 | Maloney et al. | |
| 2016/0107793 A1 | 4/2016 | Jiang et al. | |
| 2016/0121915 A1 | 5/2016 | Mkandawire et al. | |
| 2016/0221716 A1 | 8/2016 | Embleton et al. | |
| 2017/0015140 A1 | 1/2017 | Sekine et al. | |
| 2017/0037928 A1 | 2/2017 | Kronkright et al. | |
| 2017/0150636 A1 | 5/2017 | Segroves et al. | |
| 2017/0223864 A1 | 8/2017 | Jost et al. | |
| 2017/0257969 A1 | 9/2017 | Kuan et al. | |
| 2017/0273212 A1 | 9/2017 | Davis et al. | |
| 2017/0290193 A1 | 10/2017 | Franklin | |
| 2017/0307045 A1 | 10/2017 | Arias-Acosta et al. | |
| 2018/0126896 A1 | 5/2018 | Embleton et al. | |
| 2018/0127147 A1 | 5/2018 | Embleton et al. | |
| 2018/0208358 A1 | 7/2018 | Ziemer | |
| 2018/0213673 A1 | 7/2018 | Eckberg et al. | |
| 2019/0132976 A1 | 5/2019 | Clements et al. | |
| 2020/0016289 A1 | 1/2020 | Mauzerall et al. | |
| 2020/0048058 A1 | 2/2020 | Schwalbach et al. | |
| 2020/0270055 A1 | 8/2020 | Schuster | |
| 2021/0142264 A1 | 5/2021 | Curlee et al. | |
| 2021/0163050 A1 | 6/2021 | Chang | |
| 2021/0213992 A1 | 7/2021 | Curlee et al. | |
| 2021/0219443 A1 | 7/2021 | Curlee et al. | |
| 2021/0219453 A1 | 7/2021 | Curlee et al. | |

OTHER PUBLICATIONS

Caster Concepts, 5 Industries Where Shock Absorbing Caster Wheels are Perfect, Aug. 8, 2018, https://www.casterconcepts.com/industries-shock-absorbing-caster-wheels.

Crenlo, Emcor Defender Air Conditioned Server Rack Cabinets, https://www.crenlo.com/emcor/enclosures/datacom/server-cabinets/defender/.

Fernandez-Carames, Tiago M. and Fraga-Lamas, Paula, A Review on Human-Centered IoT-Connected Smart Labels for the Industry 4.0, May 7, 2018, IEEE Access, Special Section on Human-Centered Smart Systems and Technologies, vol. 6, 2018, pp. 25939-25957.

18U Open Frame 2 Post Server IT Network Data Rack HQ Relay on Casters Sysracks, https://www.amazon.com/Frame-Server-Network-Casters-Sysracks/dp/B079M19BXD.

Pelican-Hardigg Rack Mount Cases, https://www.pelican.com/us/en/professional/rack-mount-cases/.

RackLift RL5000E | 5000LB Server Cabinet Lifter, https://racklift.com/datacenter-products/racklift-rl5000e/.

ServerLift SL-500X Electric Lift, https://serverlift.com/data-center-lifts/sl-500x/.

Starcase, Elastomeric Isolation Mounts, https://www.starcase.com/Articles.asp?ID=256.

StepLift Ltd., Steplift's Server Management System, https://web.archive.org/web/20180428135226/https://www.steplift.com/server-management-system/.

Non-Final Office Action, U.S. Appl. No. 16/743,426, dated Apr. 5, 2022, U.S. Patent and Trademark Office.

Non-Final Office Action, U.S. Appl. No. 16/743,128, dated Sep. 22, 2022, U.S. Patent and Trademark Office.

Non-Final Office Action, U.S. Appl. No. 16/743,426, dated Oct. 13, 2022, U.S. Patent and Trademark Office.

* cited by examiner

INTERLOCKING TRANSPORTATION TOTES

TECHNICAL FIELD

The present disclosure relates in general to information handling systems, and more particularly to the transportation of information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Various problems are known in the field of transportation and delivery of information handling systems, particularly in the enterprise context of rack-mounted systems including a plurality of standard-sized server information handling systems. Currently, integrated rack solutions are typically delivered to customers on a wooden pallet with foam (e.g., extruded polystyrene foam) to mitigate shock events. The shipping environment is extremely harsh, and integrated rack solutions can see significant forces, causing damage to the rack or the internal equipment. Further, existing solutions tend to involve large quantities of single-use packing and shipping materials that must be discarded after delivery.

This application is related to U.S. application Ser. No. 16/681,336, filed Nov. 12, 2019, which is incorporated by reference herein in its entirety. That application discusses in detail various embodiments of shippable "totes" that may be used as an all-in-one solution to dampen shock events via shock absorbers and/or isolators fully integrated into a server rack.

The present application addresses more specifically problems that may arise in the transportation of racks and/or totes (e.g., in semi-trailers, shipping containers, and the like). Existing solutions are typically strapped in place in a truck, which is both time-consuming and a potential point of failure. The amount of discretion that is available in strapping apparatuses into a truck is also a source of problems, as different drivers may use different methods, tighten straps to varying degrees of tension, etc. Vibration during transit may cause racks to resonate within the truck, leading to high stresses. Existing shipping solutions are also quite bulky, leading to a low packing density within the truck.

Accordingly, the present disclosure provides systems of interlocking totes that may reduce the amount of discretion in packing, allow for increased packing density, and limit the effects of vibrational resonance.

The use of techniques according to this disclosure may provide many benefits. It should be noted that for the sake of concreteness, this application describes the use of totes for transportation of information handling systems. However, one of ordinary skill in the art will appreciate its applicability to other designs as well.

It should also be noted that the discussion of a technique in the Background section of this disclosure does not constitute an admission of prior-art status. No such admissions are made herein, unless clearly and unambiguously identified as such.

SUMMARY

In accordance with the teachings of the present disclosure, the disadvantages and problems associated with the transportation of information handling systems may be reduced or eliminated.

In accordance with embodiments of the present disclosure, a system may include first and second apparatuses. The first and second apparatuses may each include: an enclosure portion including a plurality of mounting features that are configured to receive information handling systems, wherein dimensions of the enclosure portion define a footprint; a base portion disposed below the enclosure portion and coupled to the enclosure portion; a plurality of casters coupled to the base portion and mounted in respective positions that are laterally displaced from the base portion such that the positions are outside the footprint of the enclosure portion; and a locking mechanism. The first and second apparatuses may be operable to be coupled together via their respective locking mechanisms for transport.

In accordance with these and other embodiments of the present disclosure, a method may include forming first and second apparatuses. Forming each such apparatus may include: forming an enclosure portion including a plurality of mounting features that are configured to receive information handling systems, wherein dimensions of the enclosure portion define a footprint; coupling a base portion to the enclosure portion below the enclosure portion; and coupling a plurality of casters to the base portion mounted in respective positions that are laterally displaced from the base portion such that the positions are outside the footprint of the enclosure portion; and coupling a locking mechanism to the apparatus. The first and second apparatuses may be operable to be coupled together via their respective locking mechanisms for transport.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
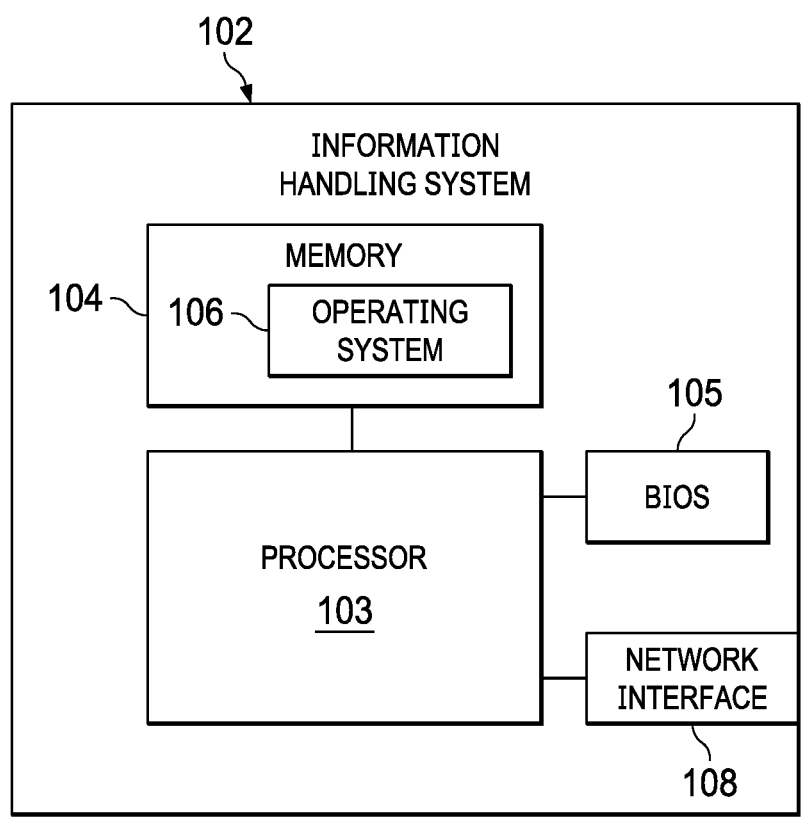
FIG. 1 illustrates a block diagram of an example information handling system, in accordance with embodiments of the present disclosure.

Preferred embodiments and their advantages are best understood by reference to FIGS. 1 through 6, wherein like numbers are used to indicate like and corresponding parts.

For the purposes of this disclosure, the term "information handling system" may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For purposes of this disclosure, when two or more elements are referred to as "coupled" to one another, such term indicates that such two or more elements are in electronic communication or mechanical communication, as applicable, whether connected directly or indirectly, with or without intervening elements.

When two or more elements are referred to as "coupleable" to one another, such term indicates that they are capable of being coupled together.

For the purposes of this disclosure, the term "computer-readable medium" (e.g., transitory or non-transitory computer-readable medium) may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; communications media such as wires, optical fibers, microwaves, radio waves, and other electromagnetic and/or optical carriers; and/or any combination of the foregoing.

For the purposes of this disclosure, the term "information handling resource" may broadly refer to any component system, device, or apparatus of an information handling system, including without limitation processors, service processors, basic input/output systems, buses, memories, I/O devices and/or interfaces, storage resources, network interfaces, motherboards, and/or any other components and/or elements of an information handling system.

FIG. 1 illustrates a block diagram of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data (which may generally be referred to as "physical storage resources"). As shown in FIG. 1, information handling system 102 may comprise a processor 103, a memory 104 communicatively coupled to processor 103, a BIOS 105 (e.g., a UEFI BIOS) communicatively coupled to processor 103, a network interface 108 communicatively coupled to processor 103. In addition to the elements explicitly shown and described, information handling system 102 may include one or more other information handling resources.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

As shown in FIG. 1, memory 104 may have stored thereon an operating system 106. Operating system 106 may comprise any program of executable instructions (or aggregation of programs of executable instructions) configured to manage and/or control the allocation and usage of hardware resources such as memory, processor time, disk space, and input and output devices, and provide an interface between such hardware resources and application programs hosted by operating system 106. In addition, operating system 106 may include all or a portion of a network stack for network communication via a network interface (e.g., network interface 108 for communication over a data network). Although operating system 106 is shown in FIG. 1 as stored in memory 104, in some embodiments operating system 106 may be stored in storage media accessible to processor 103, and active portions of operating system 106 may be transferred from such storage media to memory 104 for execution by processor 103.

Network interface 108 may comprise one or more suitable systems, apparatuses, or devices operable to serve as an interface between information handling system 102 and one or more other information handling systems via an in-band network. Network interface 108 may enable information handling system 102 to communicate using any suitable transmission protocol and/or standard. In these and other embodiments, network interface 108 may comprise a network interface card, or "NIC." In these and other embodiments, network interface 108 may be enabled as a local area network (LAN)-on-motherboard (LOM) card.

As discussed above, various problems are known in the art of transportation and delivery of information handling systems (e.g., information handling system 102). Accordingly, a transportation apparatus referred to herein as a tote may be used as an all-in-one solution that dampens shock events via shock absorbers and/or isolators fully integrated into a server rack, having a ship loadable design. Such a tote may be made of any suitable material (e.g., steel).

Figure 2A:
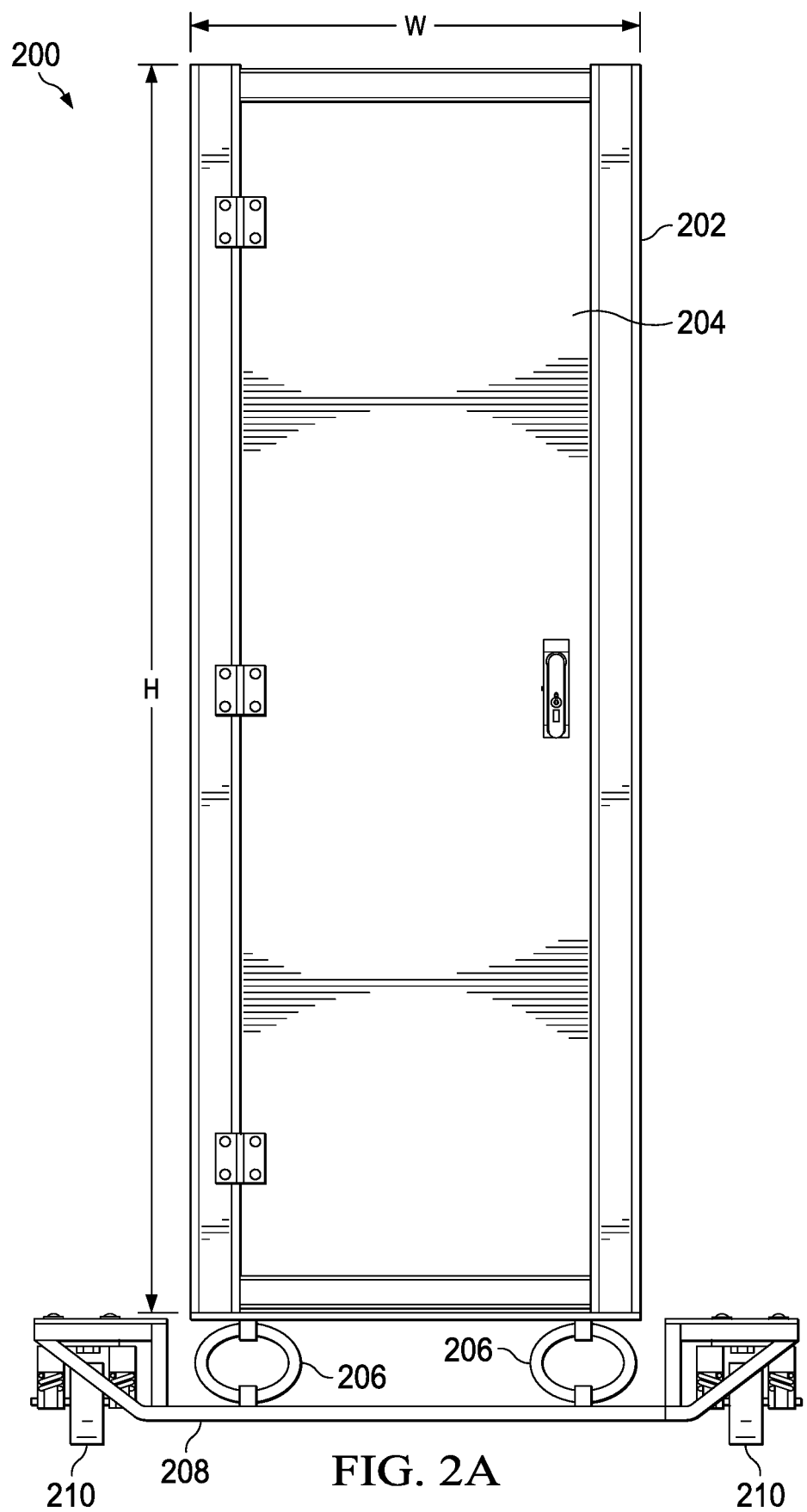
FIG. 2A illustrates a front view of an example transportation apparatus, in accordance with embodiments of the present disclosure.
Figure 2B:
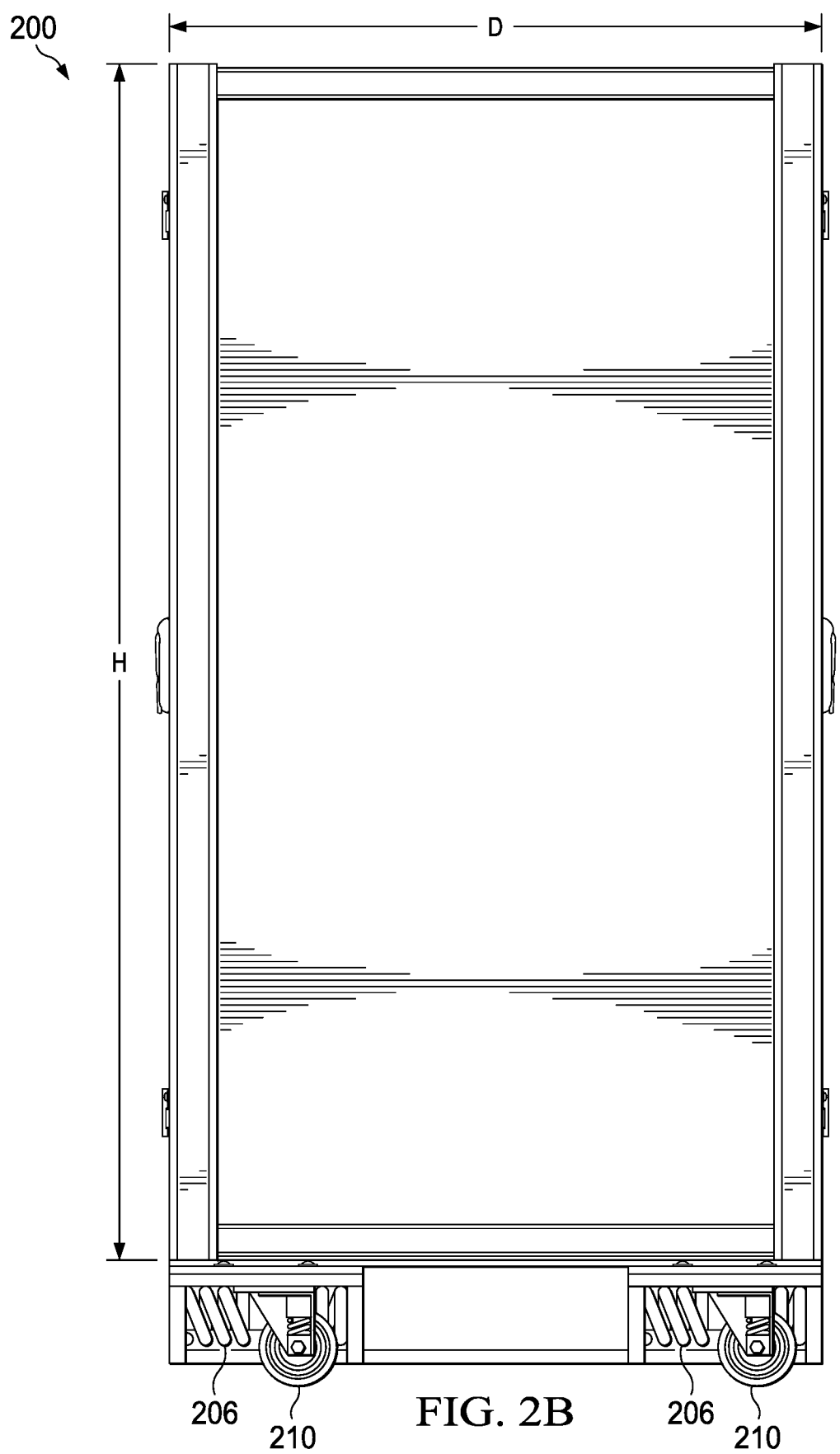
FIG. 2B illustrates a side view of the embodiment of FIG. 2A.
Figure 2C:
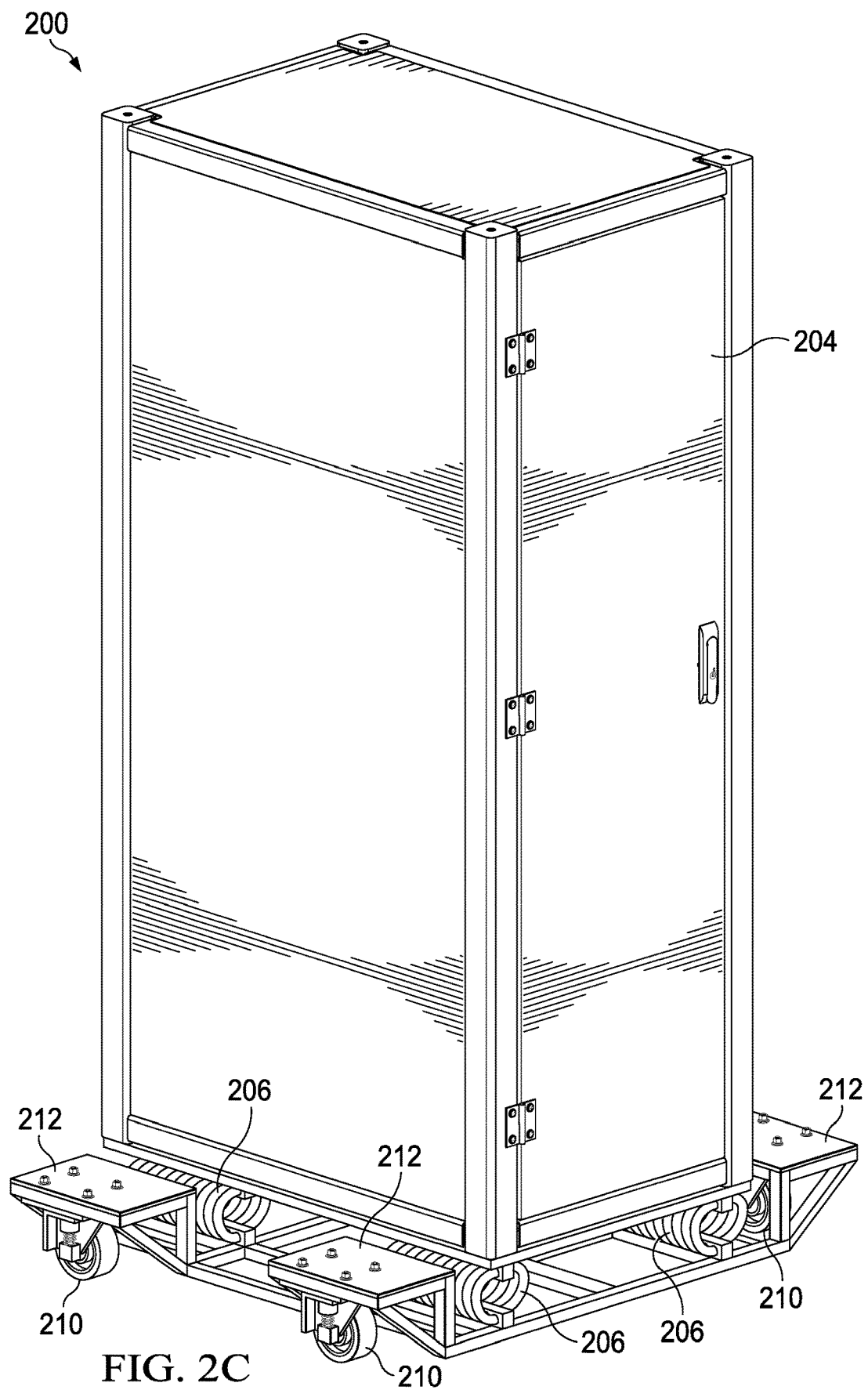
FIG. 2C illustrates a perspective view of the embodiment of FIG. 2A.

Turning now to FIGS. 2A-2C, several views are shown of an example tote 200. Tote 200 includes an enclosure portion 202 coupled on top of a base portion 208. Enclosure portion 202 may include a door 204 and a rack (not explicitly shown in these views) for receiving a plurality of information handling systems such as information handling system 102. In some embodiments, the rack may be manufactured according to a standard such as EIA-310, which defines standard rack unit sizing. For example, the embodiment shown at tote 200 may be sized to accommodate 40 rack units worth of information handling systems. In other embodiments, different sizes may be used such as 21-inch server equipment, laptops, desktops, other types of information handling systems, or information handling resources such as internet-of-things (IOT) hardware, hard drives, monitors, etc.

In some embodiments, tote 200 may be usable only for transport of information handling systems (e.g., it may not be configured for powering and operating such systems while they are received in the rack).

The rack may be isolated from vibrations during transit via the use of isolators 206. In various embodiments, isolators 206 may be wire rope, elastomeric, or any other suitable type of isolator. In the embodiment shown, isolators 206 are of the wire rope type. In some embodiments, tote 200 may also include lateral shock absorbers for protection from bumps that it may experience during integration and transportation (e.g., running into other racks, walls, truck walls, etc.).

Base portion 208 may also include casters 210 (e.g., four casters 210), which may be coupled to caster platforms 212 and may be installed in an "outrigger" configuration. For example, enclosure portion 202 has a height H, a width W, and a depth D as shown. The width and the depth may define a footprint for enclosure portion 202, and casters 210 may be disposed in positions that are laterally displaced such that they reside outside of the footprint of enclosure portion 202. In the embodiment shown, casters 210 may be shock-absorbing casters. For example, they may have integral shock dampers and/or may be mounted on shock-damping mounts.

The outrigger configuration for casters 210 may provide additional stability, when compared to a configuration in which casters 210 are within the footprint of enclosure portion 202 (e.g., below enclosure portion 202). Further, the displacement of casters 210 along the width direction but not along the depth direction may allow for the total depth of tote 200 may be minimized, allowing for movement through narrow doors, elevators, etc. Further, the need for pallet jacks may be eliminated.

Further, as described in additional detail below, this configuration for the casters may allow for totes to be coupled together in an interlocking fashion, saving space and providing other benefits.

The configuration of casters 210 and isolators 206 shown may further allow tote 200 to have a reduced total height, easing travel in constrained spaces.

Figure 3:
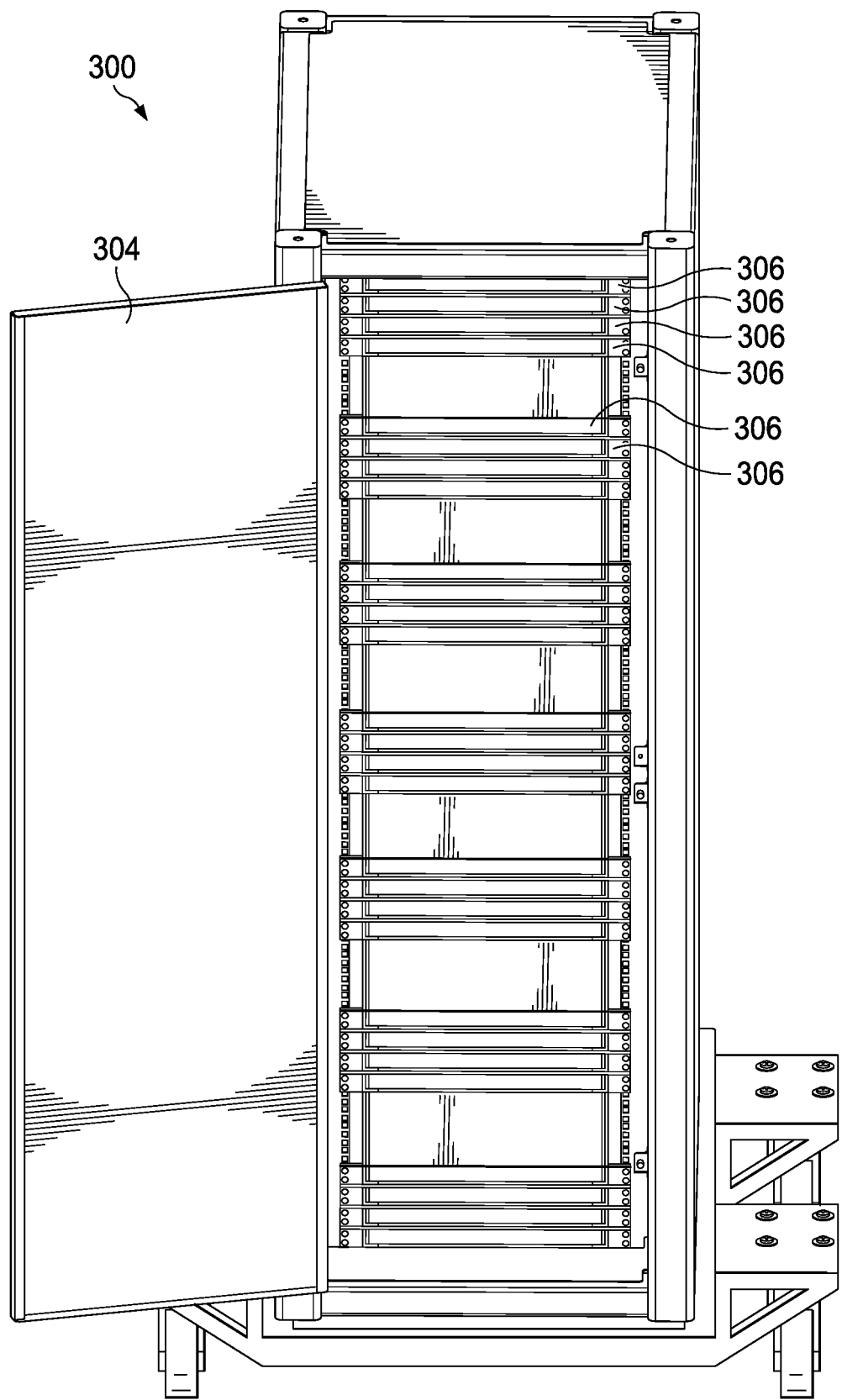
FIG. 3 illustrates a front view of another example transportation apparatus, in accordance with embodiments of the present disclosure.

FIG. 3 shows an embodiment of a similar tote 300, in which door 304 has been opened. As can be seen in this view, a plurality of mounting features 306 are disposed within the enclosure portion of tote 300. For example, mounting features may include rails, shelves, or any other suitable hardware for securely attaching and/or retaining information handling systems.

Figure 4:
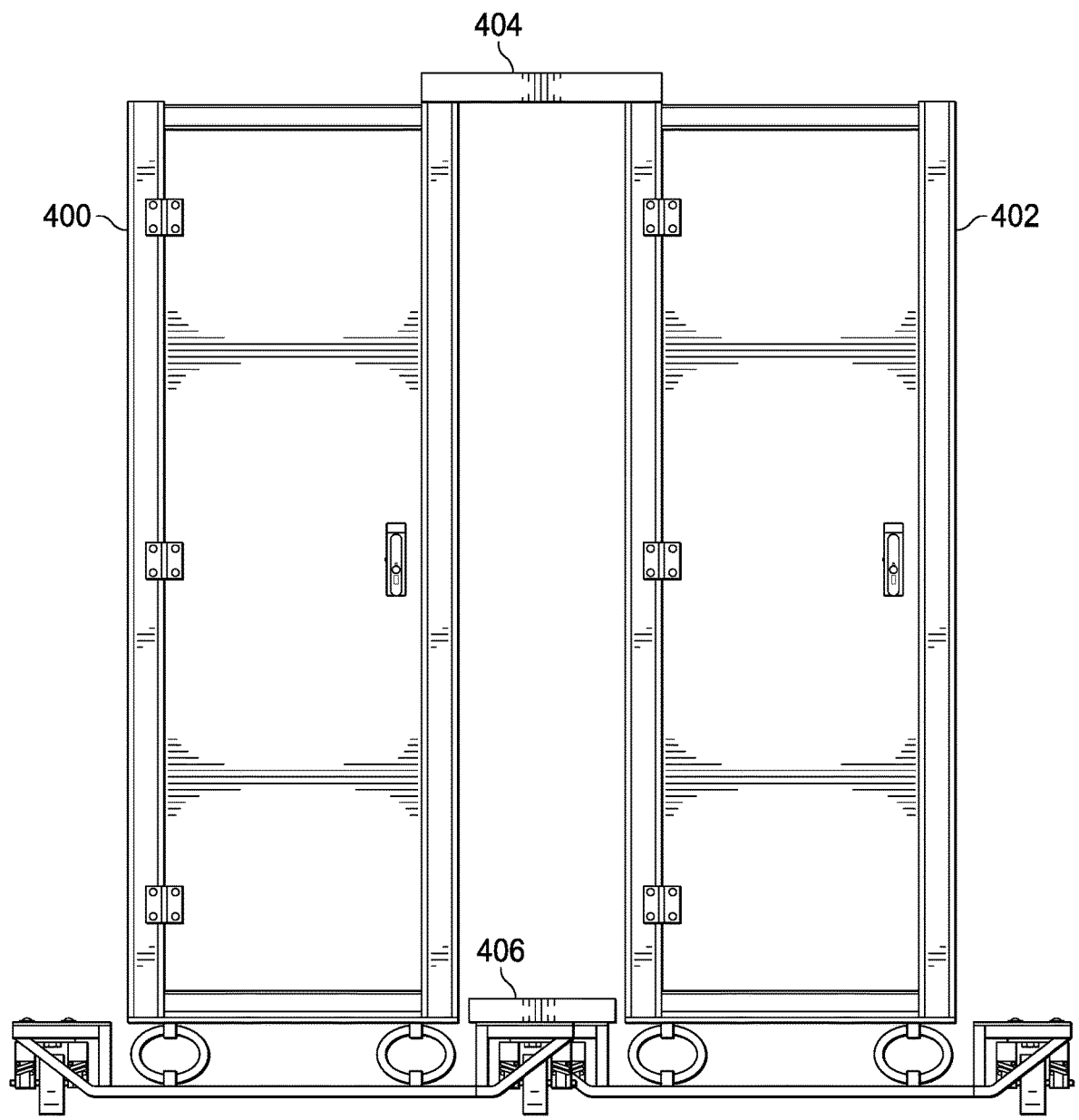
FIG. 4 illustrates a front view of a system comprising two transportation apparatuses coupled together, in accordance with embodiments of the present disclosure.

FIG. 4 shows an embodiment in which two totes 400 and 402 (which may be similar or identical to totes 200 and 300) have been interlocked together. In the embodiment shown, totes 400 and 402 are staggered such that one of the casters of tote 402 is disposed in between the casters of tote 400. As illustrated in FIG. 2C, for example, the casters of totes according to this disclosure may respectively be attached to caster platforms such as caster platforms 212. For example, the casters may be disposed below such caster platforms. Thus in order to facilitate the arrangement shown in FIG. 4, the caster platforms may be sized such that a gap between a pair of adjacent caster platforms (e.g., on tote 400) is sized to be at least as large as the corresponding physical dimension of a caster platform of the other tote (e.g., on tote 402).

Thus a caster platform of tote 402 may be insertable into the gap between caster platforms on tote 400. In some embodiments, such a gap may be sized to be as large as the physical dimension of the caster platform plus a selected clearance amount. In other embodiments (as discussed in further detail with regard to FIG. 6), such a gap may be sized to be as large as two times the physical dimension of the caster platform (and in some of such embodiments, a selected clearance amount may also be added).

FIG. 4 shows couplers 404 and 406 attached between totes 400 and 402. In various embodiments, either, both, or neither of such couplers may be employed. (For example, couplers 404 and 406 may be omitted in embodiments in which the respective caster platforms are sufficiently engaged with one another to prevent lateral motion.)

The use of such couplers may rigidly couple totes 400 and 402 together, reducing the effects of vibration and shock. For example, couplers 404 and/or 406 may be employed to prevent totes 400 and 402 from moving relative to one another, reducing the amount of external bracing required.

Coupler 404 may be attached to a top of totes 400 and 402, and coupler 406 may be attached to a bottom thereof (e.g., attached to one or more caster platforms).

In some embodiments, couplers 404 and 406 may be bolted to totes 400 and 402 (e.g., manually). In these and other embodiments, couplers 404 and 406 may be attached to totes 400 and 402 via an electromechanical actuator. For example, such an actuator may receive a wireless signal operable to cause the actuator to secure itself to the respective totes and lock them in place. Another wireless signal may be employed to cause the actuator to release itself from the respective totes. Such wireless signals may be transmitted from, for example, a mobile device of a driver or shipper tasked with loading and unloading the totes.

Figure 5:
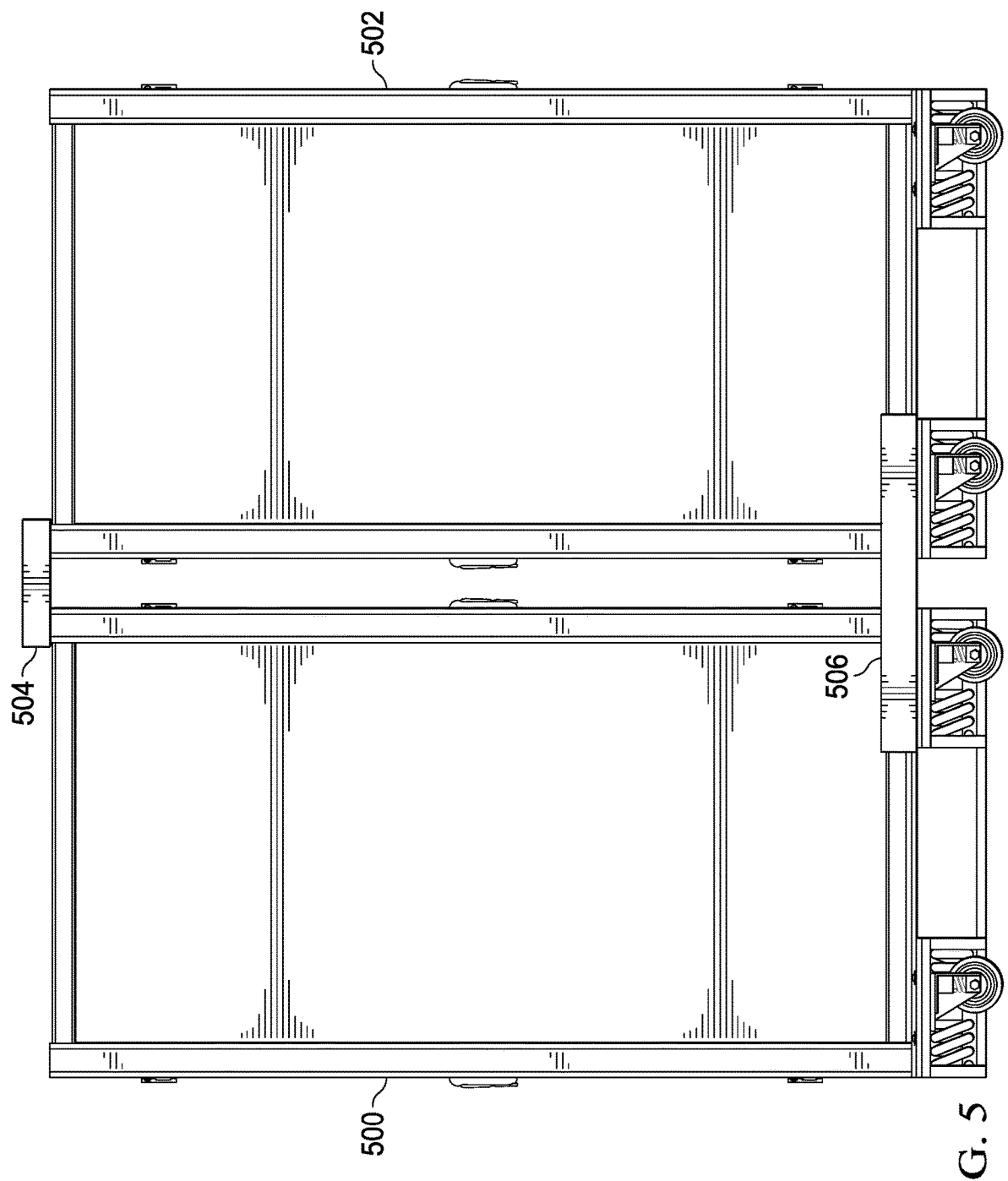
FIG. 5 illustrates a side view of another system comprising two transportation apparatuses coupled together, in accordance with embodiments of the present disclosure.

Turning now to FIG. 5, a similar arrangement is shown in which totes 500 and 502 are arranged front-to-back instead of side-by-side. Couplers 504 and/or 506 may serve a function similar to couplers 404 and/or 406 described above. As in FIG. 4, in various embodiments, either, both, or neither of such couplers may be employed.

In some embodiments, the arrangements of FIGS. 4 and 5 may be combined into an embodiment in which totes are coupled together both side-by-side and front-to-back.

Thus in some embodiments, totes according to this disclosure may be efficiently packed into a grid, such as a staggered grid. For example, the caster platforms and gaps may be sized and arranged such that successive rows of totes may be laterally offset from one another to achieve a high packing density for efficient packing inside a truck, shipping container, etc.

Figure 6:
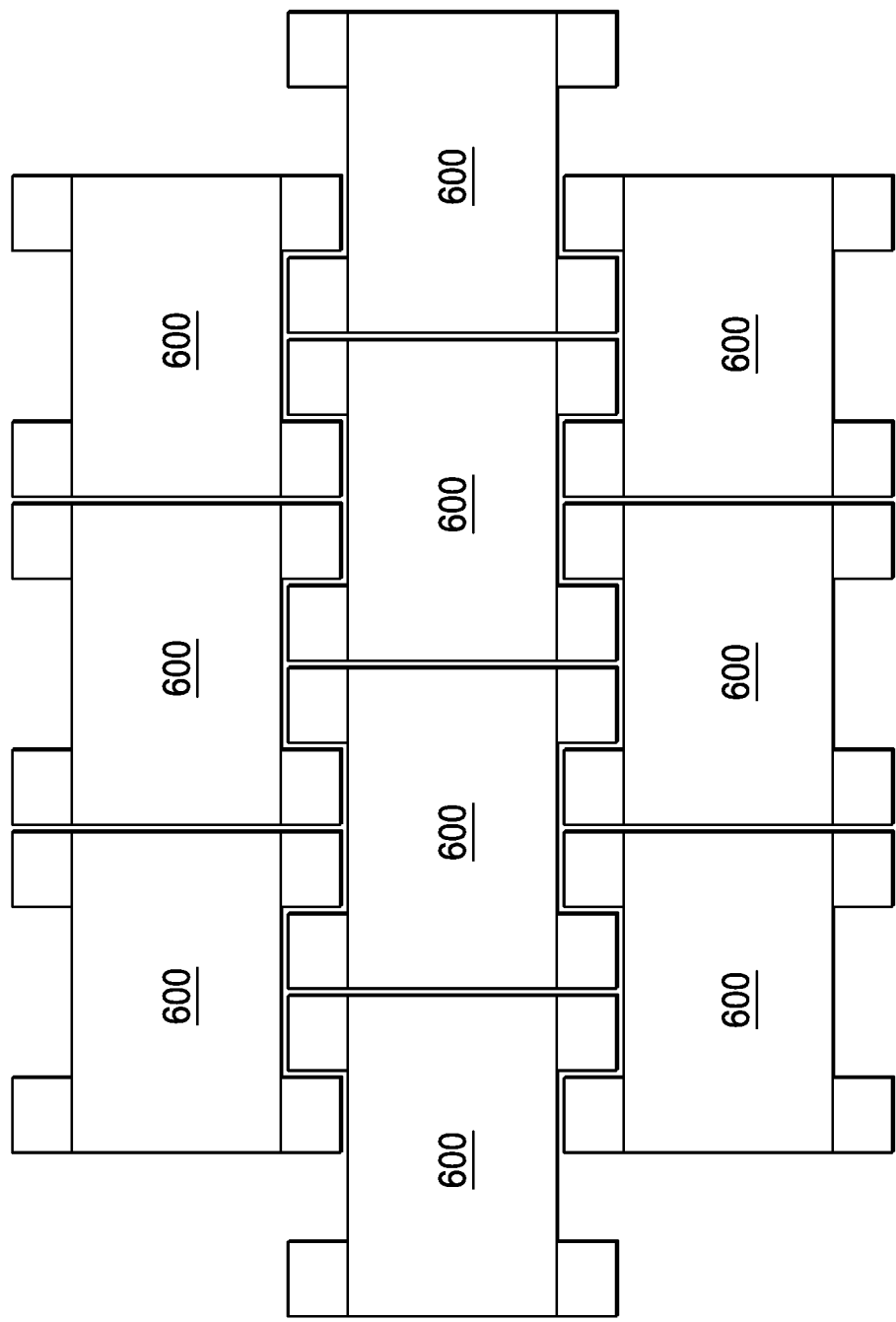
FIG. 6 illustrates a block diagram of several totes packed into a grid.

One such embodiment is shown in FIG. 6. As shown, ten totes 600 (which may be similar or identical to totes 200 and 300) are arranged in a staggered grid. The caster platforms of totes 600 are sized and arranged such that the gap between two adjacent caster platforms in a given tote 600 is large enough to accommodate two caster platforms from two adjacent totes 600. That is, the gap may be sized to be as large as two times the physical dimension of the caster platform plus a selected clearance amount. One of ordinary skill in the art with the benefit of this disclosure will appreciate that different arrangements may be used in particular circumstances to allow totes to be packed efficiently into a given space.

Although various possible advantages with respect to embodiments of this disclosure have been described, one of ordinary skill in the art with the benefit of this disclosure will understand that in any particular embodiment, not all of such advantages may be applicable. In any particular embodiment, some, all, or even none of the listed advantages may apply.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

Further, reciting in the appended claims that a structure is "configured to" or "operable to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke § 112(f) during prosecution, Applicant will recite claim elements using the "means for [performing a function]" construct.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A system comprising:
   first and second apparatuses, wherein the first and second apparatuses each include:
      an enclosure portion including a plurality of mounting features that are configured to receive information handling systems, wherein dimensions of the enclosure portion define a footprint;
      a base portion disposed below the enclosure portion and coupled to the enclosure portion;
      a plurality of casters coupled to the base portion and mounted in respective positions that are laterally displaced from the base portion such that the positions are outside the footprint of the enclosure portion; and
      a locking mechanism, wherein the locking mechanism includes a plurality of locking mechanisms including a top locking mechanism disposed on a top surface of the enclosure portion;
   wherein the first and second apparatuses are operable to be coupled together via their respective locking mechanisms for transport.

2. The system of claim 1, wherein the locking mechanism of the first apparatus is operable to be coupled to the locking mechanism of the second apparatus via a coupler bolted to the respective locking mechanisms.

3. The system of claim 1, wherein the locking mechanism of the first apparatus is operable to be coupled to the locking mechanism of the second apparatus via an electromechanical lock that is configured to be actuated wirelessly.

4. The system of claim 1, wherein the plurality of locking mechanisms includes a bottom locking mechanism disposed adjacent to a caster of the plurality of casters.

5. The system of claim 1, wherein:
   each of the plurality of casters includes a caster platform disposed above the respective caster;
   each caster platform has a physical dimension associated therewith; and
   the first apparatus includes a gap between a pair of adjacent caster platforms that is sized to be at least as large as the physical dimension of a selected caster platform of the second apparatus, such that the selected caster platform of the second apparatus is insertable into the gap.

6. The system of claim 5, wherein the gap is sized to be as large as the physical dimension of the selected caster platform of the second apparatus plus a selected clearance amount.

7. The system of claim 5, wherein each physical dimension associated with each respective caster platform is equal.

8. The system of claim 1, wherein the enclosure portion and the mounting features are sized to receive information handling systems that conform to standardized rack unit sizes.

9. The system of claim 1, wherein the enclosure portion is coupled to the base portion via at least one vibration damper.

10. The system of claim 1, wherein the plurality of casters are shock-absorbing casters.

11. The system of claim 1, wherein the first and second apparatuses are reusable such that, without the use of any single-use materials:
the first and second apparatuses are configured to have loaded therein a plurality of information handling systems, be coupled together via their respective locking mechanisms, be transported from a first location to a second location, and have the plurality of information handling systems be unloaded therefrom.

12. The system of claim 1, wherein the plurality of mounting features are compliant with EIA-310.

13. The system of claim 1, wherein the first and second apparatuses are configured for transportation of the information handling systems, but are not configured to allow for operation of the information handling systems while the information handling systems are received therein.

14. A method comprising:
forming first and second apparatuses, wherein forming each apparatus of the first and second apparatuses includes:
forming an enclosure portion including a plurality of mounting features that are configured to receive information handling systems, wherein dimensions of the enclosure portion define a footprint;
coupling a base portion to the enclosure portion below the enclosure portion; and
coupling a plurality of casters to the base portion mounted in respective positions that are laterally displaced from the base portion such that the positions are outside the footprint of the enclosure portion; and
coupling a locking mechanism to the apparatus, wherein the locking mechanism includes a plurality of locking mechanisms including a top locking mechanism disposed on a top surface of the enclosure portion;
wherein the first and second apparatuses are operable to be coupled together via their respective locking mechanisms for transport.

15. The method of claim 14, further comprising coupling the first and second apparatuses together via a coupler bolted to the respective locking mechanisms.

16. The method of claim 14, further comprising coupling the first and second apparatuses together via an electromechanical lock that is actuated wirelessly.

17. The method of claim 14, wherein the respective enclosure portions and mounting features are sized to receive information handling systems that conform to standardized rack unit sizes.

18. The method of claim 14, further comprising:
loading a first plurality of information handling systems into the enclosure portion of the first apparatus;
loading a second plurality of information handling systems into the enclosure portion of the second apparatus;
coupling the first and second apparatus together via their respective locking mechanisms;
transporting the coupled first and second apparatuses from a first location to a second location;
unloading the first and second pluralities of information handling systems; and
reusing the first and second apparatuses by loading additional information handling systems into the enclosure portions of the first and second apparatuses.

\* \* \* \* \*